US007122474B2

(12) United States Patent
Lee

(10) Patent No.: US 7,122,474 B2
(45) Date of Patent: Oct. 17, 2006

(54) METHOD FOR FORMING BARRIER METAL OF SEMICONDUCTOR DEVICE

(75) Inventor: Han-Choon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 113 days.

(21) Appl. No.: 10/725,381

(22) Filed: Dec. 3, 2003

(65) Prior Publication Data

US 2004/0115930 A1  Jun. 17, 2004

(30) Foreign Application Priority Data

Dec. 14, 2002  (KR) .................... 10-2002-0080010

(51) Int. Cl.
*H01L 21/44* (2006.01)
*H01L 21/4763* (2006.01)

(52) U.S. Cl. .................... 438/683; 438/627; 438/629; 438/630

(58) Field of Classification Search ................ 438/627, 438/629, 630, 683
See application file for complete search history.

(56) References Cited

U.S. PATENT DOCUMENTS

| 6,271,136 B1 | 8/2001 | Shue et al. |
| 6,423,201 B1 | 7/2002 | Mandrekar |
| 6,436,825 B1 | 8/2002 | Shue |
| 6,498,091 B1 | 12/2002 | Chen et al. |
| 6,596,643 B1 * | 7/2003 | Chen et al. .................. 438/706 |
| 2003/0108674 A1 * | 6/2003 | Chung et al. .......... 427/255.394 |

OTHER PUBLICATIONS

Jai-Sik Min, Hyung-Sang Park, Sang-Won Kang, Metal-orgnaic atomic-layer deposition of titanium-silicon-nitride films, Applied Physics Letters Volumne 75, No. 11, Sep. 13, 1999.*

* cited by examiner

*Primary Examiner*—Carl Whitehead, Jr.
*Assistant Examiner*—Heather Doty
(74) *Attorney, Agent, or Firm*—Pillsbury Winthrop Shaw Pittman, LLP

(57) ABSTRACT

A method for forming a barrier metal of a semiconductor device wherein a TiSiN layer having an atomic layer thickness is deposited by performing deposition of an Si layer inside a contact hole of a semiconductor device using an atomic layer deposition process and by performing deposition of a precursor layer on the Si layer. By repetition of this ALD process, the TiSiN layer is thickly formed at a desired thickness. Then, the TiSiN layer is plasma processed under the atmosphere of a nitrogen gas and a hydrogen gas, or an ammonia gas, and thus impurities are removed from the TiSiN layer. Therefore, it is easy to thickly form the TiSiN layer for the barrier metal. It is possible to reduce resistivity of the TiSiN layer to a relatively low level. Thereby, it is possible to decrease a contact resistance of the TiSiN layer and, further, to enhance an electrical characteristic of the semiconductor device.

10 Claims, 5 Drawing Sheets

METHOD FOR FORMING BARRIER METAL OF SEMICONDUCTOR DEVICE

This application claims priority from Korean Patent Application No. 10-2002-0080010, filed Dec. 14, 2002, the contents of which are incorporated herein by reference.

BACKGROUND OF THE INVENTION

1. Field of the invention

The present invention relates to a method for forming a barrier metal of a semiconductor device, particularly for forming a thick layer of TiSiN for a barrier metal having a low resistivity, using an atomic layer deposition (ALD) process.

2. Description of the Prior Art

Generally, with high integration of semiconductor devices, a design rule also becomes elaborated, and thus a size of a source/drain and a line width of a gate electrode of a MOS transistor and a line width of metallization become diminished. In particular, when the line width of the metallization is diminished, a size of a contact hole is also diminished, in which the contact hole is either for contacting the, gate electrode and the metallization or for contacting the source/drain and the metallization. If so, since contact resistances of the gate electrode and the metallization are increased, a resistance of the metallization is increased. Consequently, an operation speed of the semiconductor device is delayed. Nevertheless, it is true that a demand for speedup of the semiconductor device is more enhanced together with its high integration.

As one scheme for satisfying this demand, a layer of a high fusion metal, e.g. tungsten (W) has been recently used to reduce the contact resistance. Further, in order to reduce contact resistances of the tungsten layer and the contact region, a barrier metal is formed between the tungsten layer and the contact region. Among the barrier metals, it is a TiSiN layer that is considered as one having an excellent characteristic. However, the TiSiN layer is generally layered by a sputtering process, thus having a very high resistivity. As a result, the TiSiN layer has no choice but to have limited application as the barrier metal. Recently, in order to solve this problem, a method for forming a new layer of TiSiN has been proposed.

According to a conventional method for forming a layer of TiSiN, as shown in FIGS. 1 to 3, an insulating layer 11 is formed on a semiconductor substrate 10. Here, even though not shown in the drawings, it is apparent to those skilled in the art that, in order to define an active region of the substrate 10, a field oxide layer may be formed on a field region of the substrate 10, while a source/drain, a gate electrode, etc. of a transistor may be previously formed on the active region of the substrate 10. Subsequently, in order to expose a contact part (not shown) of the semiconductor substrate 10 using a photolithography process, the insulating layer 11 on the contact part of the semiconductor substrate 10 is etched to form a contact hole 12. Next, a precursor layer 13, for example a tetrakis dimethyl amido titanium ("TDMAT") layer is layered inside the contact hole 12 and on the insulating layer 11 at a desired thickness. Then, the precursor layer 13 is plasma processed and transformed into a TiN layer 15. Finally, the surface of the TiN layer 15 is brought into a repetitive contact with a SiH4 gas using a chemical vapor deposition (CVD) process, so that the TiN layer 15 is transformed into a TiSiN layer 17.

However, it is difficult to perform thick deposition of the TiSiN layer 17. Further, because resistivity of the TiSiN layer 17 is rather high, the TiSiN layer 17 can be only used as the barrier metal within a limited range.

Meanwhile, U.S. Pat. No. 6,271,136, titled "MULTI-STEP PLASMA PROCESS FOR FORMING TiSiN BARRIER" and issued to TSMC Company of Tiwan, discloses a method for improving a TiSiN layer as a copper barrier metal by means of Metal Organic Chemical Vapor Deposition (MOCVD) and multi-step plasma process. However, the disclosed document does not offer a solution to form a TiSiN layer for a barrier metal having a low specific resistance and a thick thickness.

SUMMARY OF THE INVENTION

Accordingly, the present invention has been made to solve the above-mentioned problems occurring in the prior art, and an object of the present invention is to provide a method for forming a barrier metal, capable of reducing a contact resistance of a TiSiN layer for the barrier metal using an atomic layer deposition process.

It is another object of the present invention is to provide a method for forming a barrier metal, capable of readily performing deposition of a TiSiN layer at a desired thickness.

It is yet another object of the present invention is to provide a method for forming a barrier metal, capable of reducing resistivity of a TiSiN layer.

In order to accomplish these objects, there is provided a method for forming a barrier metal of a semiconductor device, including: forming an insulating layer on a semiconductor substrate and forming an opening in the insulating layer; forming a TiSiN layer having a desired thickness by repeatedly performing a process of forming a TiSiN layer having an atomic layer thickness, which performs deposition of a $SiH_4$ layer inside the opening and on the insulating layer using an atomic layer deposition process and performs deposition of a certain precursor layer on the $SiH_4$ layer; and performing plasma processing for the TiSiN layer so as to remove impurities contained in the TiSiN layer.

Preferably, an Si layer may be deposited, instead of the $SiH_4$ layer.

The $SiH_4$ layer may be preferably deposited using an $SiH_4$ gas.

Further, the Si layer may be preferably deposited using the $SiH_4$ gas.

Preferably, the precursor layer may be formed by any one of a Tetrakis DiMethyl Amido Titanium (TDMAT) layer, a Tetrakis DiEthyl Amido Titanium (TDEAT) layer and a $TiCl_4$ layer.

Particularly, the TiSiN layer having the atomic layer thickness is formed by reacting the precursor layer by thermal decomposition at a temperature ranging from 350 to 450° C.

Preferably, the TiSiN layer may be plasma processed so as to remove CH based impurities contained in the TiSiN layer.

Specifically, the TiSiN layer may be plasma processed under any one atmosphere of a nitrogen gas and a hydrogen gas, or an ammonia gas.

Preferably, the opening may be formed into any one of a contact hole and a via hole.

Therefore, according to the present invention, it is easy to thickly form the TiSiN layer for the barrier metal. It is possible to reduce resistivity of the TiSiN layer to a relatively low level. Thereby, it is possible to reduce a contact resistance of the TiSiN layer and, further, to enhance an electrical characteristic of the semiconductor device.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
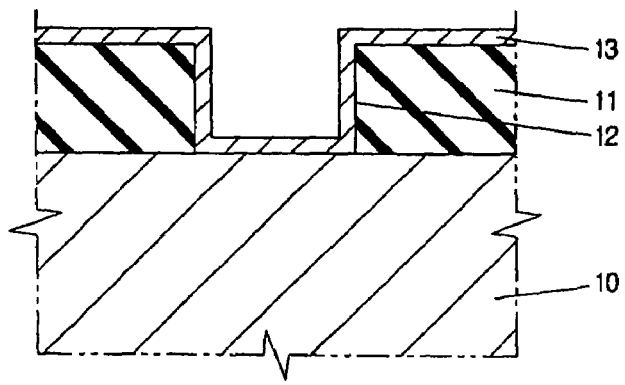
FIGS. 1 to 3 illustrate a related art method for forming a barrier metal of a semiconductor device.
Figure 2:
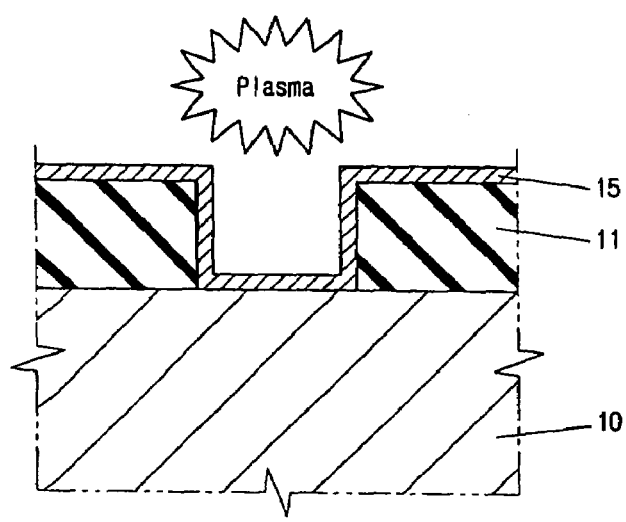

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 4 to 9 illustrate a method for forming a barrier metal of a semiconductor device according to the present invention.

Figure 4:
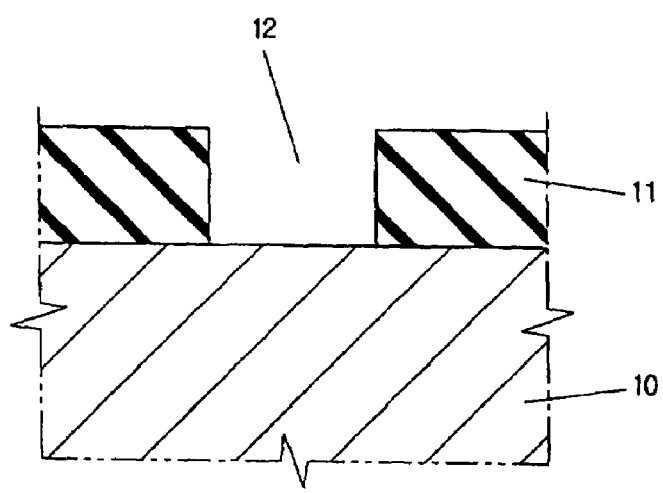
FIGS. 4 to 9 illustrate a method for forming a barrier metal of a semiconductor device according to the present invention.

Referring to FIG. 4, first, an insulating layer 11 is formed on a semiconductor substrate 10. Here, even though not shown in the figure, it is apparent to those skilled in the art that, in order to define an active region of the substrate 10, a field oxide layer may be formed on a field region of the semiconductor substrate 10, while a source/drain, a gate electrode, etc. of a transistor may be previously formed on the active region of the semiconductor substrate 10. Subsequently, in order to expose a contact part (not shown) of the semiconductor substrate 10 using a photolithography process, the insulating layer 11 on the contact part of the semiconductor substrate 10 is etched to form an opening, for example a contact hole 12. Of course, it is possible to form a via hole instead of the contact hole 12.

Subsequently, referring to FIGS. 5 to 7, a TiSiN layer 25 is formed in a reaction chamber (not shown) using an atomic layer deposition (ALD) process. In this case, the reaction chamber is preferably maintained at a predetermined temperature ranging from 350 to 450° C. and at a predetermined pressure ranging from 90 to 300 Torr.

Figure 5:
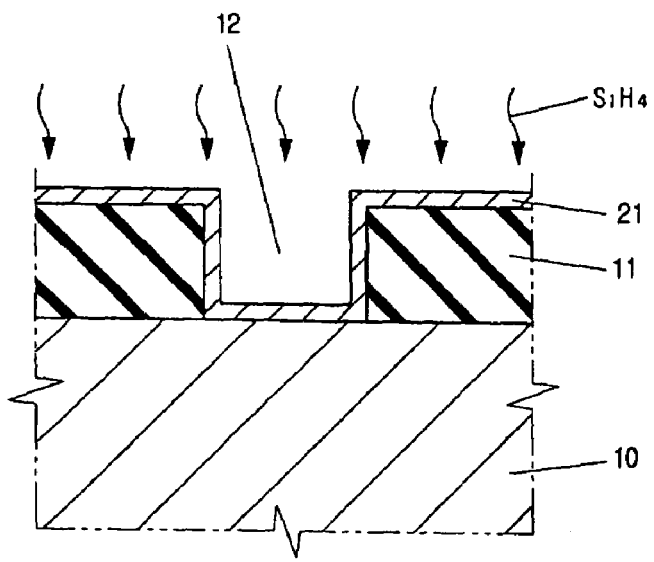

To be more specific, as shown in FIG. 5, after the semiconductor substrate 10 is mounted in the reaction chamber, a gas of $SiH_4$ is injected into the reaction chamber for a predetermined time; so that an $SiH_4$ layer 21 is deposited inside the contact hole and on the insulating layer 11 at a desired thickness which is relatively thin. Here, instead of the $SiH_4$ layer 21, an Si layer may be deposited using the $SiH_4$ gas.

Figure 6:
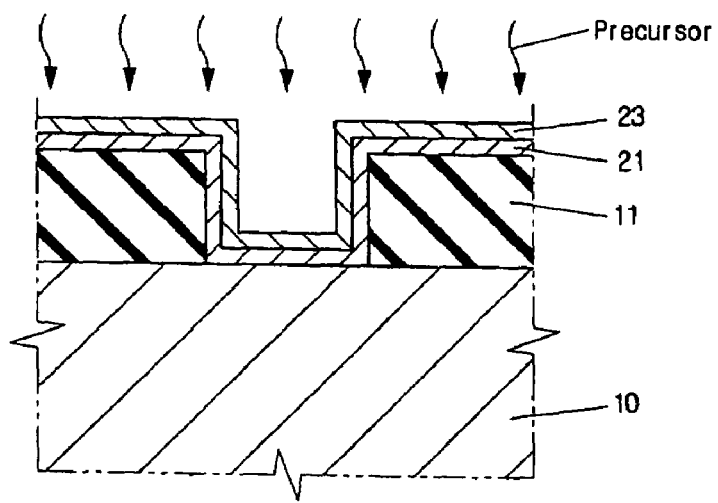

Next, as shown in FIG. 6, after injection of the $SiH_4$ gas is stopped, an inert gas such as a nitrogen ($N_2$) gas or argon (Ar) gas is injected for a predetermined time, and thus the $SiH_4$ gas which may remain in the reaction chamber is completely discharged.

Subsequently, a gas for a precursor is injected into the reaction chamber for a predetermined time, so that a relatively thin precursor layer 23 is deposited on the $SiH_4$ layer 21 at a desired thickness. Here, as the precursor gas, any one of Tetrakis DiMethyl Amido Titanium (TDMAT), Tetrakis DiEthyl Amido Titanium (TDEAT) and $TiCl_4$ may be used. The precursor layer 23 may be formed by any one of a TDMAT layer, a TDEAT layer and a $TiCl_4$ layer according to the gas for the precursor.

Figure 7:
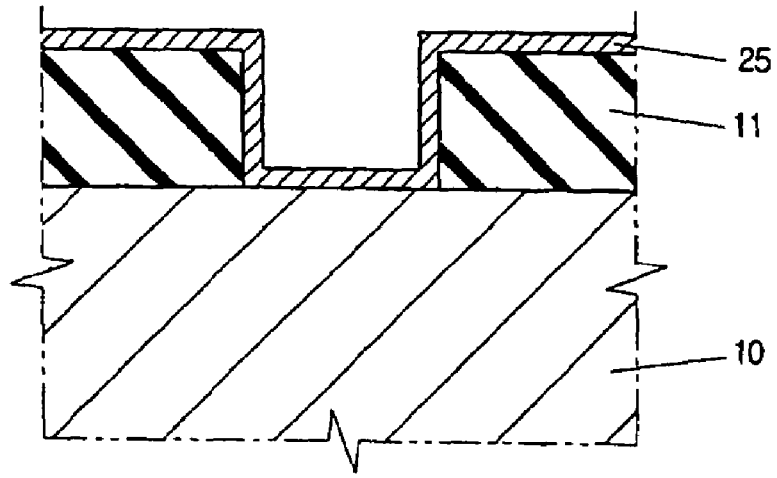

Here, materials of the $SiH_4$ layer 21 and the precursor layer 23 are reacted by thermal decomposition at the temperature of the reaction chamber, for example in the temperature range from 350 to 450° C., so that the TiSiN layer 25 is formed at an atomic layer thickness, as shown in FIG. 7.

Subsequently, after injection of the gas for the precursor is stopped, the inert gas such as nitrogen ($N_2$) gas or argon (Ar) gas is injected for a predetermined time, and thus the gas for the precursor which may remain in the reaction chamber is completely discharged.

Figure 8:
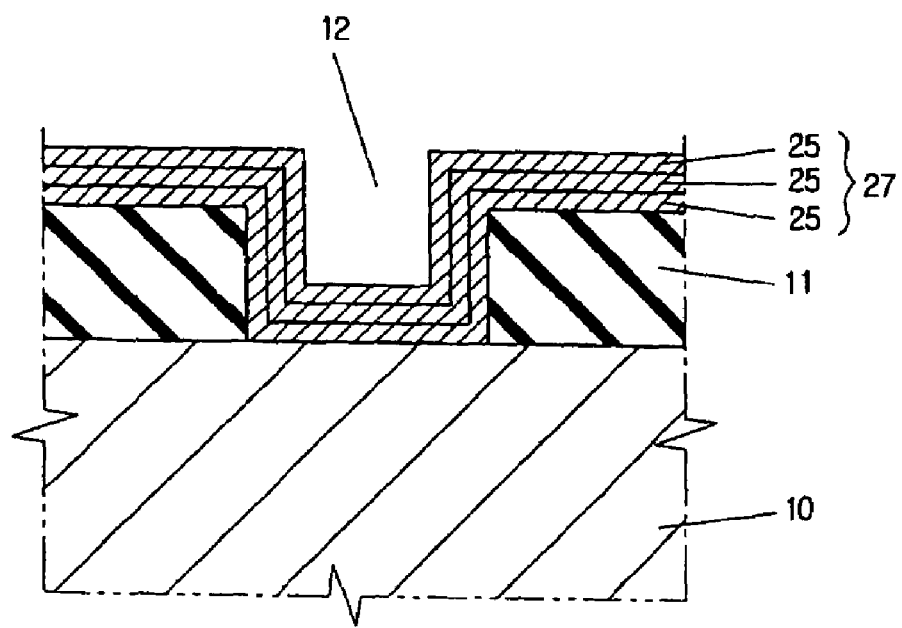

In this manner, the ALD process is performed at desired repetition times, for example 3 times. To be specific, as shown in FIG. 8, the TiSiN layer 25 is continuously deposited inside the contact hole 12 and on the insulating layer 11 at three layers. As a result, the TiSiN layer 25 is changed into a thicker TiSiN layer 27.

Meanwhile, for the sake of convenience of description, the thicker TiSiN layer 27 is shown as constituted of three TiSiN layers 25, but it is apparent that in reality, by changing the repetition times of the foregoing process, the thicker TiSiN layer 27 may be constituted of either three or more TiSiN layers 25 or three or less TiSiN layers 25.

Figure 3:
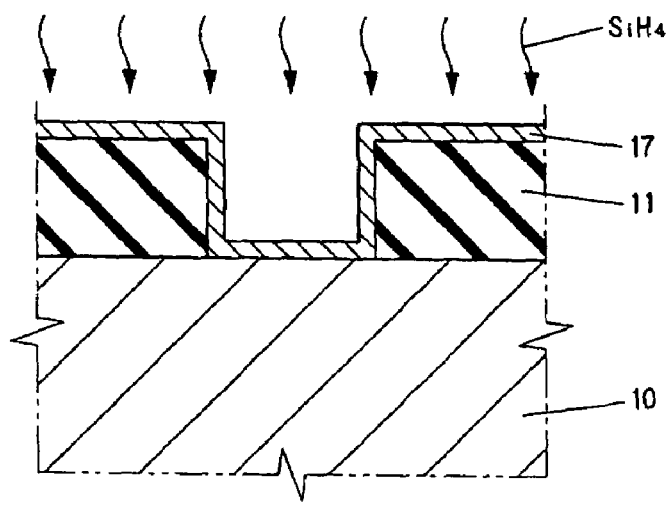
Figure 9:
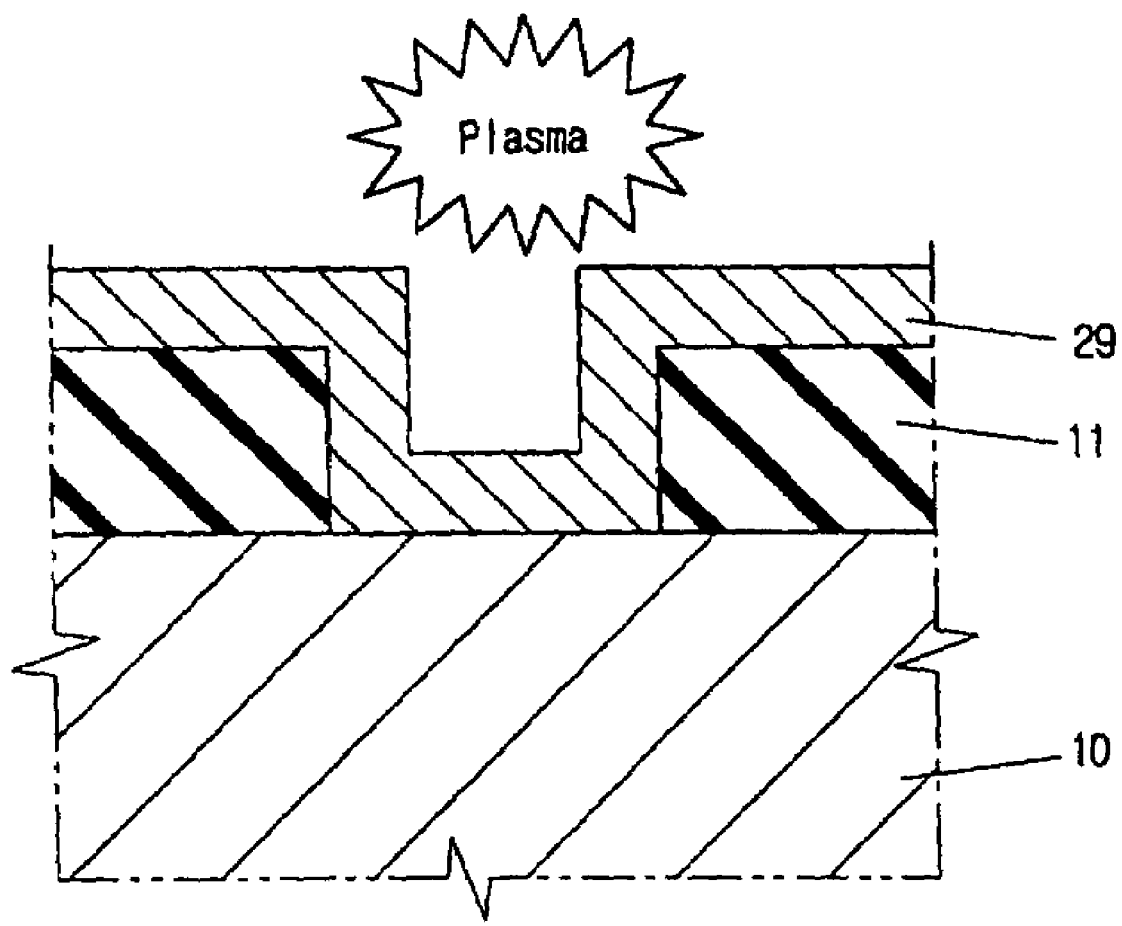

Then, referring to FIG. 9, in order to remove impurities contained in the thicker TiSiN layer 27 of FIG. 8, for example CH based impurities, the thicker TiSiN layer 27 is plasma processed under the atmosphere of a hydrogen ($H_2$) gas and a nitrogen ($N_2$) gas, or an ammonia ($NH_3$) gas, thus forming a final TiSiN layer 29. Here, the final TiSiN layer 29 has a relatively low resistivity to such an extent appropriate for the barrier metal, compared with the TiSiN layer 17 of FIG. 3.

Thus, according to the present invention, it is possible to form a thick TiSiN layer for a preferable barrier metal having a low resistivity, which reduces a contact resistance of a semiconductor device and, further, increases an electrical characteristic, such as an operation speed of the semiconductor device.

Thereafter, even though not shown in the Figures, additional process for the contact hole, for example a metal layer plug process or a metallization process may be performed.

As described above, in the method for forming a barrier metal of a semiconductor device according to the present invention, TiSiN layer is formed at an atomic layer thickness by performing deposition of an $SiH_4$ layer inside a contact hole of the semiconductor device using an ALD process and by performing deposition of a precursor layer on the $SiH_4$ layer. By repetition of this ALD process, the TiSiN layer can be thickly formed at a desired thickness. Then, the TiSiN layer is plasma processed under the atmosphere of a hydrogen ($H_2$) gas and a nitrogen ($N_2$) gas, or an ammonia ($NH_3$) gas, thus removing impurities in the TiSiN layer.

Therefore, according to the present invention, it is easy to thickly form the TiSiN layer for the barrier metal. Further, it is possible to reduce resistivity of the TiSiN layer to a relatively low level. As a result, it is possible to reduce a contact resistance of the TiSiN layer and, further, to enhance an electrical characteristic of the semiconductor device.

Although a preferred embodiment of the present invention has been described for illustrative purposes, those skilled in the art will appreciate that various modifications, additions and substitutions are possible, without departing from the scope and spirit of the invention as disclosed in the accompanying claims.

The entire disclosure of the Korean Patent Application No. 10-2002-0080010 filed on Dec. 14, 2002 including specification, claims, drawings and summary are incorporated herein by reference in its entirety.

What is claimed is:

1. A method for forming a barrier metal of a semiconductor device, comprising:

forming an insulating layer on a semiconductor substrate and forming an opening in the insulating layer;

forming a TiSiN layer having a desired thickness by repeatedly performing a process of forming a TiSiN layer having an atomic layer thickness in a reaction chamber, wherein the process of forming a TiSiN layer having an atomic layer thickness comprises performing deposition of a Si layer inside the opening and on the insulating layer using an atomic layer deposition process, discharging a gas remaining in the reaction chamber by using an inert gas, performing deposition of a certain precursor layer on the Si layer, and discharging a gas of precursor material remaining in the reaction chamber by using an inert gas; and performing plasma processing for the TiSiN layer so as to remove impurities contained in the TiSiN layer, wherein a pressure of the reaction chamber is between 90 and 300 Torr.

2. The method of claim 1, wherein the Si layer is deposited using an $SiH_4$ gas.

3. The method of claim 1, wherein the precursor layer is formed by any one of a Tetrakis DiMethyl Amido Titanium (TDMAT) layer, a Tetrakis DiEthyl Amido Titanium (TDEAT) layer and a $TiCl_4$ layer.

4. The method of claim 2, wherein the precursor layer is formed by any one of a Tetrakis DiMethyl Amido Titanium (TDMAT) layer, a Tetrakis DiEthyl Amido Titanium (TDEAT) layer and a $TiCl_4$ layer.

5. The method of claim 3, wherein the TiSiN layer having the atomic layer thickness is formed by reacting the precursor layer by thermal decomposition at a temperature ranging from 350 to 450° C.

6. The method of claim 4, wherein the TiSiN layer having the atomic layer thickness is formed by reacting the precursor layer by thermal decomposition at a temperature ranging from 350 to 450° C.

7. The method of claim 1, wherein the TiSiN layer is plasma processed so as to remove CH based impurities contained in the TiSiN layer.

8. The method of claim 7, wherein the TiSiN layer is plasma processed under any one atmosphere of a nitrogen gas and a hydrogen gas, or an ammonia gas.

9. The method of claim 1, wherein the opening is formed into any one of a contact hole and a via hole.

10. The method of claim 1, wherein the inert gas is a nitrogen or argon gas.

* * * * *